(12) United States Patent  
Descamps et al.

(10) Patent No.: US 7,645,999 B2  
(45) Date of Patent: Jan. 12, 2010

(54) METHOD AND APPARATUS FOR CREATING A PLASMA

(75) Inventors: Pierre Descamps, Rixensart (BE); Patrick Leempoel, Brussels (BE)

(73) Assignee: Dow Corning Corporation, Midland, TX (US)

( * ) Notice: Subject to any disclaimer, the term of this patent is extended or adjusted under 35 U.S.C. 154(b) by 1 day.

(21) Appl. No.: 12/064,249

(22) PCT Filed: Aug. 21, 2006

(86) PCT No.: PCT/IB2006/002253

§ 371 (c)(1),  
(2), (4) Date: Jun. 16, 2008

(87) PCT Pub. No.: WO2007/023350

PCT Pub. Date: Mar. 1, 2007

(65) Prior Publication Data

US 2008/0245969 A1    Oct. 9, 2008

(30) Foreign Application Priority Data

Aug. 24, 2005 (GB) .................................. 0517334.9

(51) Int. Cl.  
*B23K 10/00* (2006.01)  
*H05H 1/46* (2006.01)  
*H01J 27/00* (2006.01)

(52) U.S. Cl. .............. 250/423 R; 250/424; 315/111.21; 315/111.41; 315/111.51; 315/111.71; 315/111.81; 219/124.43; 219/121.36; 219/121.52; 118/723 MA; 118/723 MR; 118/723 MW

(58) Field of Classification Search ............. 250/423 R, 250/424; 219/121.21, 121.6, 121.38, 121.41, 219/121.43, 121.48, 121.49, 121.52, 121.54, 219/121.55, 121.61, 121.62; 315/111.21, 315/111.41, 111.51, 111.71, 111.81, 111.91; 118/723 MA, 723 MR, 723 MW, 723 ME See application file for complete search history.

(56) References Cited

U.S. PATENT DOCUMENTS 5,162,633 A * 11/1992 Sonobe et al. ......... 219/121.43  
5,292,395 A *  3/1994 Fujiwara ................. 156/345.42  
5,466,295 A    11/1995 Getty .................. 118/723 MA (Continued)

OTHER PUBLICATIONS

Popov et al., *Plasma Sources Sci. Technol.* 1:7-12 (Mar. 1992).

(Continued)

*Primary Examiner*—Bernard E Souw  
(74) *Attorney, Agent, or Firm*—Williams, Morgan & Amerson

(57) ABSTRACT

An apparatus is provided for producing a plasma for a work surface, for example to deposit material thereon. The apparatus comprises an enclosure which contains an ionizable gas, a plurality of plasma excitation devices each of which is arranged to enable microwaves to travel from a first end thereof to a second end and radiate therefrom into the gas, and means for generating a magnetic field in the gas. A source of microwaves feeds microwaves to the first ends of the excitation devices. In use, regions exist within the said gas where the direction of the electric vector of the microwaves is non-parallel to the lines of the magnetic field, and the magnetic field has value B, and the microwaves have a frequency f such as to substantially satisfy the relationship: $B = \pi m f D e$ where m and e are the mass and charge respectively of an electron.

13 Claims, 3 Drawing Sheets

U.S. PATENT DOCUMENTS

| | | | |
|---|---|---|---|
| 5,629,054 A * | 5/1997 | Kanai | 427/575 |
| 5,874,706 A * | 2/1999 | Ishii et al. | 219/121.43 |
| 6,225,592 B1 * | 5/2001 | Doughty | 219/121.43 |
| 6,407,359 B1 * | 6/2002 | Lagarde et al. | 219/121.43 |
| 2006/0065195 A1 * | 3/2006 | Nagatsu | 118/723 MW |
| 2007/0045244 A1 * | 3/2007 | Lee et al. | 219/121.43 |
| 2008/0245969 A1 * | 10/2008 | Descamps et al. | 250/423 R |

OTHER PUBLICATIONS

Popov et al., *Journal of Vacuum Science & Technology* 10(5):3055-3059 (Sep./Oct. 1992).

* cited by examiner

METHOD AND APPARATUS FOR CREATING A PLASMA

This application claims priority from Application GB 0517334.9, filed on Aug. 24, 2005, and is the national phase of International Application PCT/IB2006/002253, filed on Aug. 21, 2006.

This invention relates to a method and apparatus for creating a plasma, and further relates to a method and apparatus in which, once produced, the plasma is caused to treat a work surface, for example by causing deposition of material thereon. More particularly, it concerns the use of microwave energy to produce the plasma by electron cyclotron resonance. Although the invention is applicable to various forms of surface treatment, for example etching, chemical or thermochemical treatment, spraying, cleaning, disinfection, decontamination, or producing ion beams obtained by extracting plasma, the following description concentrates on deposition. One area of particular interest is in depositing a film of silicon by dissociation of a silane precursor, for example $SiH_4$, in a process known as plasma-enhanced CVD (chemical vapor deposition).

In the technical field of exciting a plasma to electron cyclotron resonance (hereinafter abbreviated to "ECR"), resonance is obtained when the frequency of gyration of an electron in a static or quasi-static magnetic field is equal to the frequency of the applied accelerating electric field. This resonance is obtained for a magnetic field B at an excitation frequency f which is related to B by the following relationship:

$$B = 2\pi f/e \tag{1}$$

where m and e are the mass and the charge of an electron.

When exciting a plasma at electron cyclotron resonance frequency electrons revolve in phase with the electric field and continuously gain energy from the external excitation source to reach the threshold energy necessary for ionizing the gas. To satisfy this condition, it is necessary firstly for the radius of gyration of the electron to be small enough, in particular to enable it to remain in that region of space in which resonance conditions exist, i.e. the simultaneous presence of the electric field and of the magnetic field satisfying equation (1), and small enough with respect to the static magnetic field gradient for the electron to see a substantially constant magnetic field during its gyration, and secondly that the frequency of gyration remains large relative to the frequency of collision between electrons and neutral elements such as atoms and/or molecules. In other words, the best conditions for exciting a plasma to electron cyclotron resonance are expected to be obtained when simultaneously gas pressure is relatively low and the excitation frequency f is high, which also means that the magnetic field intensity B must be high.

A major difficulty with conventional ECR is that it is not possible to produce a plasma whose density is substantially uniform over a large area. This means that it cannot be used, for example, to deposit a substantially uniform layer of material on a work surface of large size. To overcome this problem, a technique has been developed which is known as distributed electron cyclotron resonance (DECR), which employs an apparatus in which a plurality of plasma excitation devices is formed into a network, with the devices collectively generating a plasma whose density is substantially uniform at the work surface. The individual plasma excitation devices are each constituted by a wire applicator of microwave energy, having one end connected to a source for producing microwave energy and having an opposite end fitted with at least one magnetic dipole for creating at least one surface having a magnetic field that is constant and of an intensity corresponding to electron cyclotron resonance. The dipole is mounted at the end of the microwave applicator in such a manner as to ensure that electrons accelerated to electron cyclotron resonance oscillate between the poles so as to create a plasma diffusion zone situated on the side of the dipole that is remote from the end of the applicator. The individual excitation devices are distributed relative to one another and in proximity with the work surface so as to create together a plasma that is uniform for the work surface.

Such a DECR apparatus is described in U.S. Pat. No. 6,407,359 (corresponding to EP-1075168), and a more detailed discussion of the apparatus described therein is given below.

However, although the DECR apparatus described in EP-1075168 has advantages over a conventional ECR apparatus, it still has limitations. One limitation is that for a given microwave frequency f there is only one value of magnetic field B which will satisfy the equation given above, and vice versa. The particular values referred to in EP-1075168 are f=2.45 GHz and B=875 Gauss (0.0875 tesla). This limitation represents a problem, because there are only certain bands within the microwave spectrum which are available for industrial use, other bands being licensed for various types of communication. The frequency of 2.45 GHz referred to in EP-1075168 is suitable because it lies within one of the available bands (2.4-2.5 GHz). However, the magnetic field of 875 Gauss which use of 2.45 GHz entails is at the high end of what is currently practical. Although a very low magnetic field could not be used without undesirably reducing the extent of plasma containment, it would be possible, and desirable from a practical point of view, to be able to use a somewhat lower magnetic field. However, any attempt to do so is restricted by the fact that at the lower magnetic field, the frequency entailed by the above equation may not be industrially available. Conversely, it might be desirable to use a significantly higher frequency than 2.45 GHz, in order to further increase plasma density. However, the above equation would then entail a correspondingly high magnetic field, which would, even if industrially available, at least be difficult and expensive to produce, and might be impossible in practice.

A second limitation of DECR apparatuses used hitherto is that although, when used for the deposition of a film on a substrate, they can produce films over large areas which have a uniformity which is acceptable for some purposes, the uniformity still leaves much to be desired. Thus, films deposited using this technology show inhomogeneities (in thickness and most probably in film structure) below at each individual antenna location. The present inventors have been able to observe these inhomogeneities by generating interference fringes, which are visible underneath the antenna locations. Without wishing to be bound by this explanation, the present inventors attribute this inhomogeneity to static magnetic field lines extending to the surface of the substrate which is being coated. During deposition of the films a bright shell may be observed, surrounding each individual antenna and extending down to the surface of the substrate. The light emitted within these shells is much more intense than in the rest of plasma volume, which indicates a higher level of excitation of species within the shells (that de-excite via light emission). This is also most probably also associated with a greater degree of film precursor dissociation, explaining the inhomogeneity in film deposition.

An obvious way to resolve the inhomogeneity issue would be to increase the distance between the antennas and the substrate to prevent high plasma density shells being in close proximity with the substrate and also allow more species diffusion. However, this would be accompanied by a significant loss in deposition efficiency and hence by a significant decrease in deposition rate.

According to the present invention, there is provided an apparatus for producing a plasma for a work surface, the apparatus comprising an enclosure adapted to contain an ionizable gas; a plurality of plasma excitation devices each of which is arranged to enable microwaves to travel from a first end thereof to a second end and radiate therefrom into the said gas, and each of which has means for generating a magnetic field in the gas in the region of its second end; and a source of microwaves connected to feed microwaves to the first ends of the excitation devices; wherein the said magnetic field has value B, and the microwaves have a frequency f such as to substantially satisfy the relationship:

$$B = \pi m f / e \quad (2)$$

where m and e are the mass and charge respectively of an electron, and wherein, in use, regions exist within the said gas where the direction of the wave propagation vector of the microwaves is non-parallel to the lines of the magnetic field.

Conventional ECR proceeds on the assumption, which is broadly correct, that the magnetic field lines in the region where the microwaves are propagating and the plasma is being created are substantially parallel to the direction of microwave propagation. Under these conditions one would expect damping, i.e. absorption of microwave energy and, therefore, plasma creation, to take place only when Equation (1) above is substantially satisfied, and one would not expect it when Equation (2) is substantially satisfied. The present invention is based on the realisation that in a DECR apparatus there are significant regions in the gas where the angle between the direction of microwave propagation and the direction of the magnetic field lines deviates substantially from zero or, to put it another way, where the direction of microwave propagation has a component which is perpendicular to the magnetic field lines. It can be shown that under such circumstances damping of the microwaves will occur at a combination of frequency and magnetic field which substantially satisfies Equation (2).

It should be added that when a plasma is generated by conventional ECR, other damping mechanisms appear to be involved in addition to the electron cyclotron resonance itself. Likewise, when a plasma is generated according to the present invention other damping mechanisms appear to be involved in addition to the modified form of electron cyclotron resonance represented by Equation (2).

The present inventors are aware of a report in the prior art of particular plasma behaviour at the frequency used in the present invention. This is in an article entitled "2.45 GHz microwave plasmas at magnetic fields below ECR", by Oleg A. Popov, Sergei Y. Shapoval and Merle D. Yoder Jr., in Plasma Services Sci. Technol, 1 (1992) pp 7-12. However, the work described in the Popov article uses a conventional ECR apparatus, in which the magnetic field lines in the region where the microwaves are propating and the plasma is being created are substantially parallel to the direction of microwave propagation. As explained above, in this region the only damping mechanism which might be expected to exist would be classical ECR damping, and that only operates when Equation (1) is satisfied. Accordingly, the skilled person reading Popov would not consider that a frequency other than that defined by Equation (1) would be likely to give a good performance, and, indeed, the present inventors believe that it would not have done so.

By way of example, the method of the present invention could employ the frequency of 2.45 GHz used in the above-identified prior art, but a magnetic field of only 437.5 Gauss, i.e. half the prior art value of 875 Gauss. Another possibility would be to use a magnetic field of 1035 Gauss, which, though higher than 875 Gauss, is still feasible, and a microwave frequency of 5.8 GHz, which lies within a band of the microwave spectrum which is available for industrial use. That latter would be advantageous in terms of generating a high density plasma, though, unlike the former, it would not address the question of inhomogeneity in a film deposited from the plasma.

The invention is further described below with reference to the accompanying drawings, in which.

The present invention can be practiced using the prior art apparatus shown in FIG. 1 to 3 (with the crucial change however, in relationship between B and f which the present invention requires), and a description of that apparatus will now be given, based on the description given in EP-1075168. It is to be understood, however, that the apparatus might take many other forms instead, provided there is a plasma generating region where the direction of microwave propagation is not parallel to the magnetic field lines.

Figure 1:
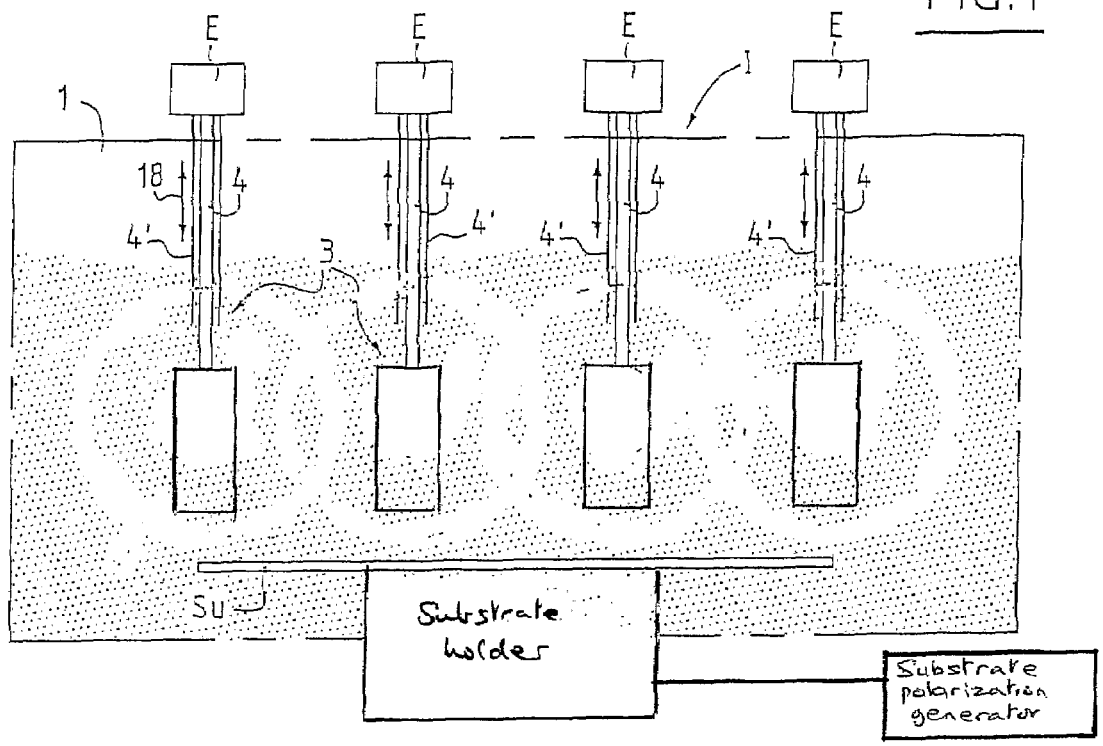
FIG. 1 is a diagrammatical elevation view showing a plasma production apparatus as described and shown in EP-1075168.
Figure 2:
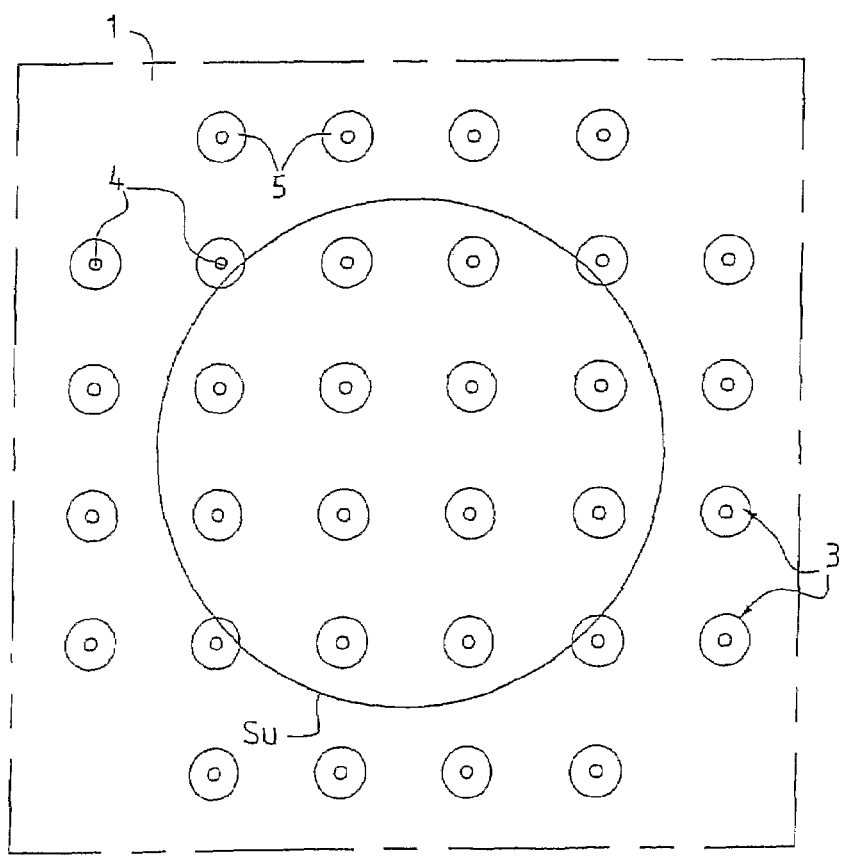
FIG. 2 is a plan view of the apparatus of FIG. 1.
Figure 3:
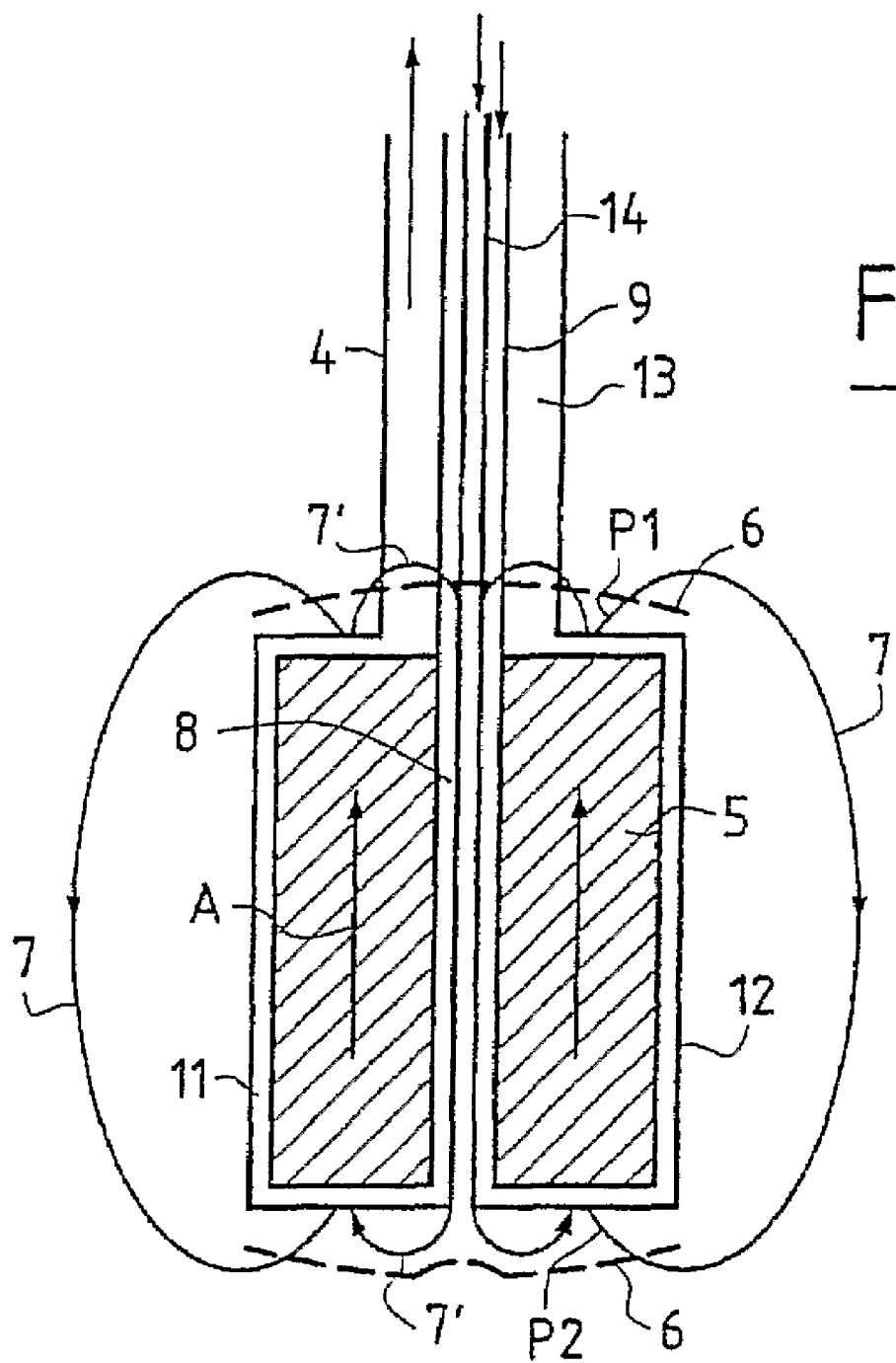
FIG. 3 is a more detailed view of an embodiment of one of the individual plasma excitation devices employed in the apparatus of FIGS. 1 and 2.

FIGS. 1 and 2 show an apparatus I for producing a plasma relative to a work surface $S_u$ ("work" in a broad sense), which can be constituted, for example, by a surface that is suitable for receiving various surface treatments. In conventional manner, the apparatus I comprises a sealed enclosure 1 represented diagrammatically and fitted with devices for admitting gas and for pumping gas out, not shown but known per se, that enable the pressure of the gas that is to be ionized to be maintained at a desired value which, for example, can be about $10^{-2}$ to $2 \times 10^{-1}$ Pascals, depending on the nature of the gas and the excitation frequency. However, gas pressures less than $10^{-2}$ Pa (say down to $10^{-4}$ Pa, for example), or above $2 \times 10^{-1}$ Pa (say, up to $5 \times 10^{-1}$ Pa, or even 1 Pa or more), can be used. The gas may, for example, comprise $SiH_4$ or $H_2$ as a reactive gas, together with a non-reactive gas such as He, Ne or Ar. The gas feeding system should ensure the appropriate flow of gases, which typically ranges from 1 to 1000 sccm (standard cubic centimeters per second), into the reactor according to the process specifications.

The plasma chamber is equipped with a substrate holder, whose function is to hold the substrate $S_u$ in the plasma chamber in the appropriate operating conditions. These are typically to heat the substrate to the required deposition temperature, typically between room temperature and 600° C. This can be achieved by circulating a hot fluid inside the substrate holder but could also be achieved by electrically heating resistors embedded in the substrate holder. Another function of the substrate holder is to allow polarization of the substrate such as to control the energy of ions towards the substrate. Polarization can either be RF or DC and requires the substrate holder to be electrically insulated. Polarization is achieved by connecting the electrically insulated substrate holder to an appropriate RF or DC generator with adequate matching circuit in the case of RF polarization.

The plasma production apparatus I has a series of individual plasma excitation devices 3 spaced apart from one another and located in the proximity of the work surface SU so as to operate together to create a plasma that is uniform for the work surface SU. Each individual plasma excitation device 3 is constituted by a microwave energy applicator 4 implemented in the form of a wire, i.e. that is elongate. Each wire applicator 4 has one of its ends connected to a microwave energy source E (preferably via a coaxial structure 4'), which source lies outside the enclosure 1. Alternatively however, a single microwave energy source can feed microwaves to all the applicators 4, or there can be a plurality of energy sources fewer in number than the number of applicators. Each wire applicator 4 is advantageously in the form of a tube surrounded by a coaxial tube 4', thus enabling microwave energy to propagate to the free end $4_1$ thereof while avoiding radiating microwaves and avoiding microwave coupling between the applicators. In order to ensure proper transfer of the microwave energy into the plasma, each microwave wire feeding the plasma excitation devices is preferably equipped with a matching device that minimizes, or at least reduces, the reflected power from the plasma excitation device. As shown more particularly in FIG. 3, each microwave applicator 4 is designed to have its free end $4_1$ connected to at least one permanent magnet 5. In FIG. 3 the magnet is shown as having its magnetic axis parallel to the long axis of the magnet itself, corresponding to what is described further below with reference to FIG. 5. In one particular form of this arrangement all the plasma excitation devices have their magnets oriented in the same direction (a monopolar configuration), i.e. all their north poles are at the top and all their south poles at the bottom, or vice versa. In another, some of each pole are at the top and some of each pole are at the bottom (a multipolar configuration). An example of the latter is an array, where viewed from one end as in FIG. 2, and passing along any given row or column of devices, one successively encounters poles of alternate polarity. Yet another example is where all the magnets in a given row (or column) have the same polarity, but the columns (or rows) are of alternate polarity. However, arrangements can also be used where the magnetic axes of the magnets are not parallel to the long axes of the magnets themselves, as will be explained further below.

If the magnets were solid, at least a fraction of the electron paths would encounter the wire applicator 4 such that a fraction of the electrons would thus be collected by the wire applicator 4, thereby giving rise to a loss of electrons. This drawback can be avoided by using an axially-magnetized cylindrical magnet 5 having a central bore 8 on its magnetization axis, as shown in FIG. 3. In this embodiment, a fraction 7' of the magnetic field lines pass along the central bore 8 of the magnet. Furthermore, the magnetic poles are no longer points but describe circle centered on the axis of revolution of the magnet and towards which the magnetic filed lines 7 and 7' converge. Thus, if the diameter of the outer envelope of the applicator 4 is equal to the diameter of the circle described by the magnetic pole, electrons accelerated by electron cyclotron resonance cannot describe trajectories that follow the field lines 7'. As a result, the end $4_1$ of the wire applicator does not go past the magnetic pole. The only usable field lines are therefore the field lines 7 external to the magnet, and consequently no electron path encounters the wire applicator 4 between the two mirror points $P_1$ and $P_2$. As a result no electrons are lost and optimum performance can be obtained in terms of energy efficiency.

Each axial bore 8 can be used to enable a cooling fluid feed pipe 9 to be installed which advantageously also serves as a support on which the magnet 5 is mounted. This pipe 9 is implemented in the form of a tube whose end communicates with an enclosure 11 defined between the magnet and a jacket 12 surrounding the magnet at a distance therefrom. The enclosure 11 opens out into a cooling fluid return pipe 13 defined between the feed pipe 9 and the wire applicator 4 constituted by a tube. The magnet 4 is thus encapsulated by the protective jacket 12 that enables a cooling fluid to circulate around the magnet. By way of example, the material in which the magnet is encapsulated and the material constituting the wire applicators is a non-magnetic material that is a good conductor (a nonmagnetic metal). However for contamination reasons, they can also be surrounded by dielectric materials without spoiling proper operation of the device.

Figure 4:
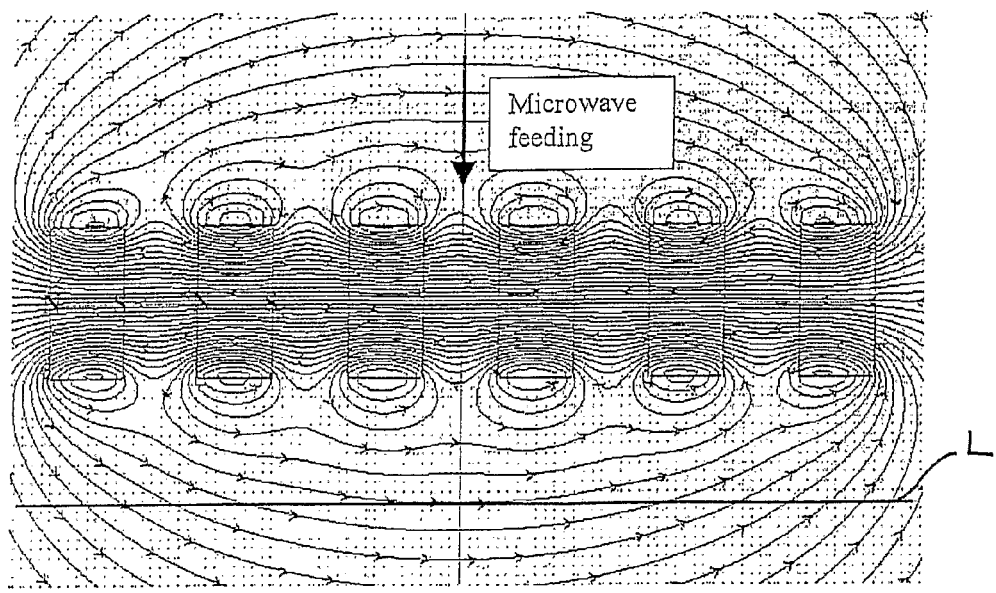
FIG. 4 shows the magnetic field lines generated by one arrangement of magnets which can be used in the present invention.
Figure 5:
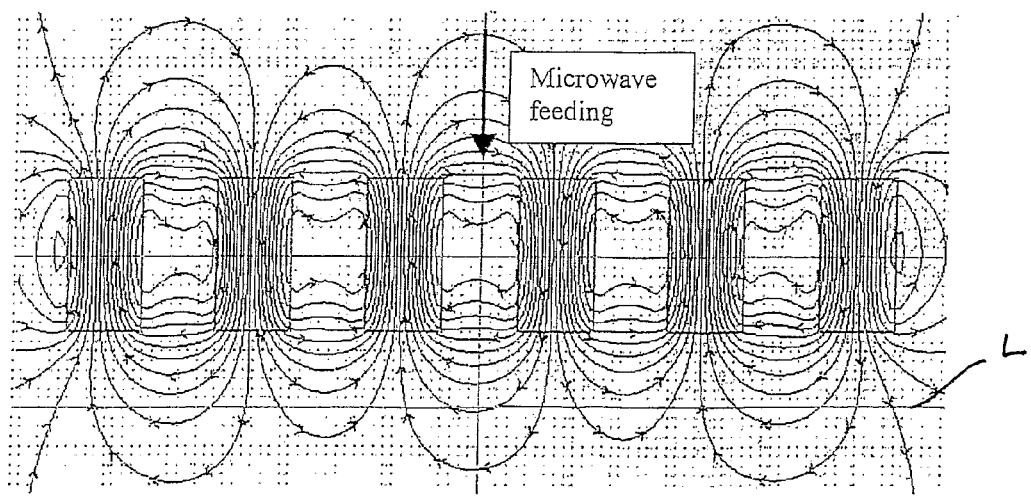
FIG. 5 shows the magnetic field lines generated by another arrangement of magnets which can be used in the present invention.

FIGS. 4 and 5 show, by way of example, two possible arrangements of the magnets, and the resulting magnetic fields. In FIG. 4 the magnets are in a multi-polar arrangement, the north of one magnet facing the south of its neighbour. The magnetic axis is perpendicular to the long axis of the magnet and hence perpendicular to the electric vector of the microwaves, the direction of whose travel is indicated in FIG. 4. By way of example, each of the magnets is a cylindrical magnet having a field strength of 2000 Gauss, a length of 8 cm and a diameter of 4 cm.

A line L is marked in FIG. 4, situated about 4 cm away from the magnet ends and it can be shown that the magnetic field over the length of this line, perpendicular to the electric field generated by the microwaves, is substantially constant and has a value of about 437.5 G. The magnetic strength along the line L is substantially that needed to provide damping with 2.45 GHz microwaves at the first harmonic, in accordance with the present invention.

Another example is shown in FIG. 5, for which the magnetic axis is now perpendicular to the long axis of the magnet (which itself will be parallel to the electric vector). The magnets are also in a multi-polar arrangement, the north of one being on the same side as the south of its neighbour(s) but here the magnetic axis is parallel to the long axis of the magnet. Each of the magnets has the same dimensions as in FIG. 4, but a field strength of 1000 Gauss.

Once again, the magnetic field along the line L shown in the drawing is substantially constant, with a strength of 437.5 G and meets the requirements for damping at the first harmonic with 2.45 GHz microwaves.

The invention claimed is:

1. An apparatus for producing a plasma for a work surface, the apparatus comprising:
   an enclosure adapted to contain an ionizable gas;
   a plurality of plasma excitation devices each of which is arranged to enable microwaves to travel from a first end thereof to a second end and radiate therefrom into the said gas;
   means for generating a magnetic field in the gas; and
   a source of microwaves connected to feed microwaves to the first ends of the excitation devices;
   wherein the said magnetic field has value B, and the microwaves have a frequency f such as to substantially satisfy the relationship:

$$B = nmf/e$$

where m and e are the mass and charge respectively of an electron, and
   wherein, in use, regions exist within the said gas where the direction of the wave propagation vector of the microwaves is non-parallel to the lines of the magnetic field.

2. An apparatus according to claim 1, wherein each plasma excitation device is associated with a respective magnet.

3. An apparatus according to claim 2, wherein the plasma excitation devices with their respective magnets are disposed in an array defining rows and columns of devices.

4. An apparatus according to claim 3, wherein the array is a rectangular array.

5. An apparatus according to claim 2, wherein the magnets are arranged with their magnetic axes generally parallel to the direction of travel of the microwaves.

6. An apparatus according to claim 2, wherein the magnets are arranged with their magnetic axes generally perpendicular to the direction of travel of the microwaves.

7. An apparatus according to claim 5 or 6, wherein within each row and column, alternate magnets are oriented in opposite directions to one another.

8. An apparatus according to claim 5 or 6, wherein the magnets are all oriented in the same direction as one another.

9. An apparatus according to claim 5 or 6, wherein within each row alternate magnets are oriented in the same direction as one another, and within each column alternate magnets are oriented in opposite directions to one another.

10. An apparatus according to claim 1, wherein a common microwave source is connected to feed microwaves to all the excitation devices.

11. An apparatus according to claim 1, wherein the microwave source comprises a plurality of sub-sources, each feeding at least one of the excitation devices.

12. A method for producing a plasma for a work surface, comprising:
supplying an ionizable gas to an enclosure therefor;
feeding microwaves from a source thereof to respective first ends of a plurality of plasma excitation devices, to cause the microwaves to travel from the first end thereof to a second end and radiate therefrom into the said gas;
and generating a magnetic field in the gas;
wherein the said magnetic field has value B, and the microwaves have a frequency f such as to substantially satisfy the relationship:

$$B = nmf/e$$

where m and e are the mass and charge respectively of an electron, and
wherein regions exist within the said gas where the direction of the wave propagation vector of the microwaves is non-parallel to the lines of the magnetic field.

13. A method according to claim 12, carried out using an apparatus according to claim 2.

* * * * *